United States Patent
Kim et al.

(10) Patent No.: US 11,239,175 B2
(45) Date of Patent: Feb. 1, 2022

(54) SEMICONDUCTOR PACKAGE

(71) Applicant: SAMSUNG ELECTRONICS CO., LTD., Suwon-si (KR)

(72) Inventors: Young-Ho Kim, Seoul (KR); Hwan Pil Park, Hwaseong-si (KR); Sung-Chul Kim, Asan-si (KR); Key-One Ahn, Seoul (KR)

(73) Assignees: SAMSUNG ELECTRONICS CO., LTD., Suwon-si (KR); INDUSTRY-UNIVERSITY COOPERATION FOUNDATION HANYANG UNIV, Seoul (KR)

( * ) Notice: Subject to any disclaimer, the term of this patent is extended or adjusted under 35 U.S.C. 154(b) by 0 days.

(21) Appl. No.: 16/865,470

(22) Filed: May 4, 2020

(65) Prior Publication Data

US 2020/0402915 A1      Dec. 24, 2020

(30) Foreign Application Priority Data

Jun. 21, 2019   (KR) .................. 10-2019-0074185

(51) Int. Cl.
*H01L 23/538*       (2006.01)
*H01L 23/552*       (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ............. H01L 23/5389; H01L 23/5383; H01L 23/5386; H01L 23/552; H01L 23/66; H01L 24/20; H01L 24/19; H01L 21/4857; H01L 21/4853; H01L 21/565; H01L 23/3128; H01L 2924/3025; H01L 2223/6672; H01L 2223/6677; H01L 2223/49833;
(Continued)

(56) References Cited

U.S. PATENT DOCUMENTS 6,865,084 B2    3/2005  Lin et al.
7,582,951 B2    9/2009  Zhao et al.
(Continued)

FOREIGN PATENT DOCUMENTS

CN           107452720          12/2017

OTHER PUBLICATIONS

"Innovative technology of EMI shielding", CNI Technology, EMI Shield, 2019, 3 pages.

*Primary Examiner* — Kyoung Lee
*Assistant Examiner* — Christina A Sylvia
(74) *Attorney, Agent, or Firm* — F. Chau & Associates, LLC

(57) ABSTRACT

A semiconductor package includes: a substrate; a semiconductor chip disposed on a first surface of the substrate; solder bumps disposed between a first surface of the semiconductor chip and the substrate; and a redistribution layer provided on a second surface, opposite to the first surface, of the semiconductor chip. The substrate includes substrate patterns, and the substrate patterns cover a second surface of the substrate. The substrate patterns cover 60% to 100% of a total area of the second surface of the substrate.

20 Claims, 7 Drawing Sheets

(51) Int. Cl.
    *H01L 23/66*     (2006.01)
    *H01L 23/00*     (2006.01)
    *H01L 21/48*     (2006.01)
    *H01L 21/56*     (2006.01)
    *H01Q 1/38*     (2006.01)
    *H01L 23/31*     (2006.01)

(52) U.S. Cl.
    CPC ........ *H01L 21/565* (2013.01); *H01L 23/3128* (2013.01); *H01L 23/5383* (2013.01); *H01L 23/5386* (2013.01); *H01L 23/552* (2013.01); *H01L 23/66* (2013.01); *H01L 24/19* (2013.01); *H01L 24/20* (2013.01); *H01Q 1/38* (2013.01); *H01L 2223/6672* (2013.01); *H01L 2224/214* (2013.01); *H01L 2924/3025* (2013.01)

(58) Field of Classification Search
    CPC ..... H01L 2223/49827; H01L 2224/214; H01L 2224/0401; H01L 2224/92224; H01L 2224/12105; H01L 2224/04105; H01L 2224/16235; H01L 2224/73259; H01Q 1/38; H01Q 1/40; H01Q 1/2283; H01Q 21/065; H01Q 9/0414

See application file for complete search history.

(56) References Cited

U.S. PATENT DOCUMENTS

| | | | |
|---|---|---|---|
| 7,675,465 | B2 | 3/2010 | Doan et al. |
| 7,852,281 | B2 | 12/2010 | Choudhury |
| 8,378,466 | B2 | 2/2013 | Chiu et al. |
| 8,411,444 | B2 | 4/2013 | Gaynes et al. |
| 8,779,564 | B1 | 7/2014 | Knudsen et al. |
| 9,368,866 | B2 | 6/2016 | Yu |
| 9,653,805 | B2 | 5/2017 | Kamgaing et al. |
| 9,991,216 | B2 | 6/2018 | Liao et al. |
| 2002/0096767 | A1 | 7/2002 | Cote et al. |
| 2007/0188384 | A1 | 8/2007 | Liu |
| 2010/0052108 | A1* | 3/2010 | Barth, Jr. ........... H01L 23/5223 257/621 |
| 2016/0260684 | A1* | 9/2016 | Zhai ..................... H01L 21/568 |
| 2017/0040266 | A1* | 2/2017 | Lin ..................... H01L 23/5383 |
| 2020/0036081 | A1* | 1/2020 | Li ......................... H01L 23/20 |

* cited by examiner

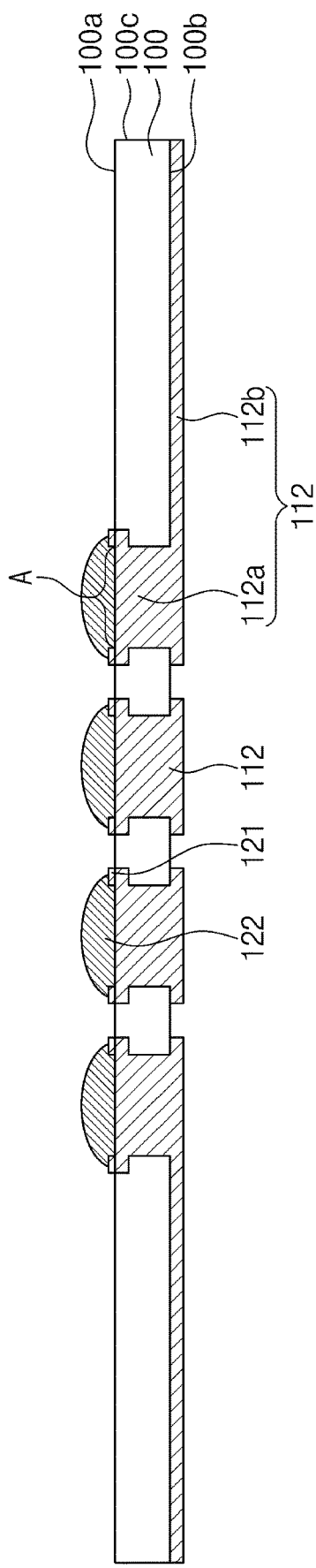
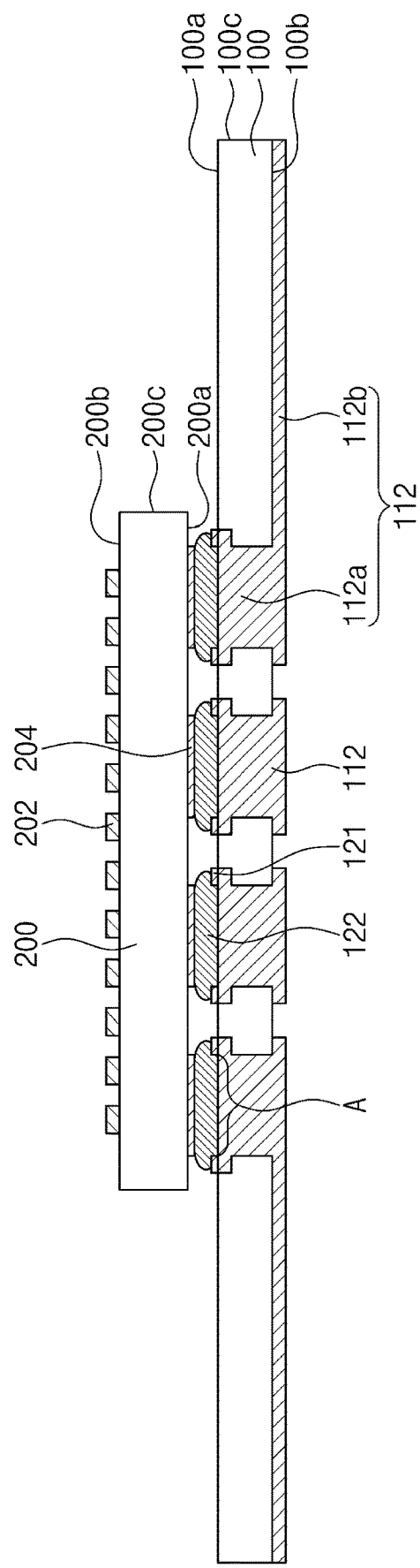

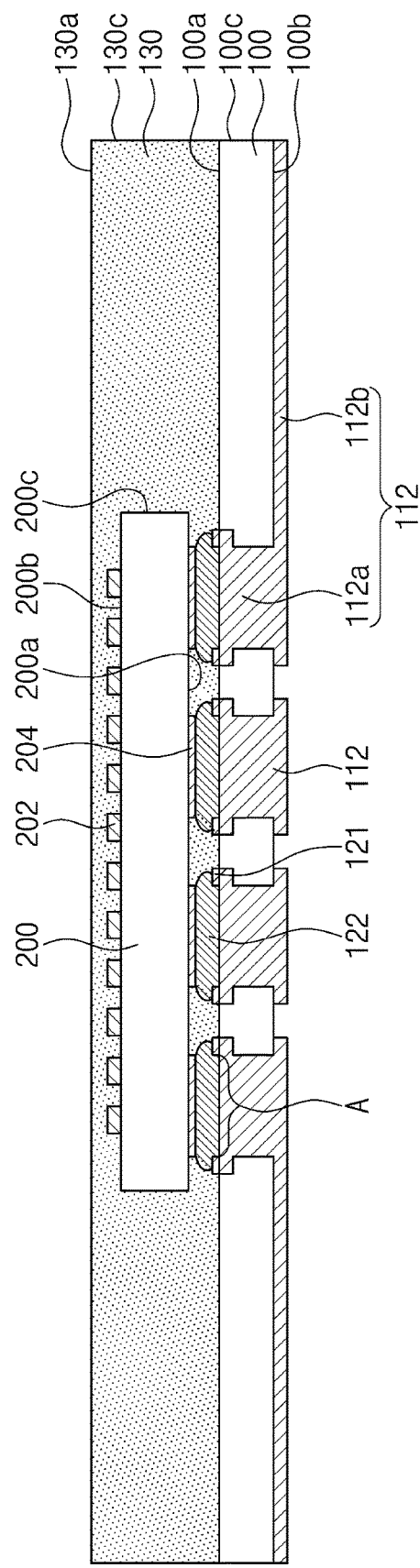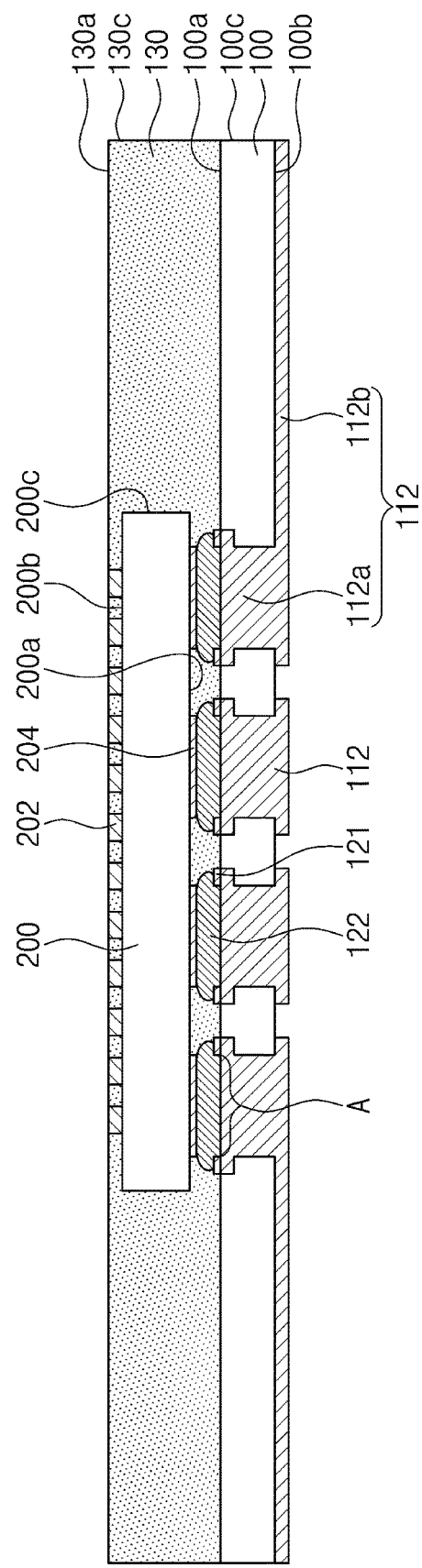

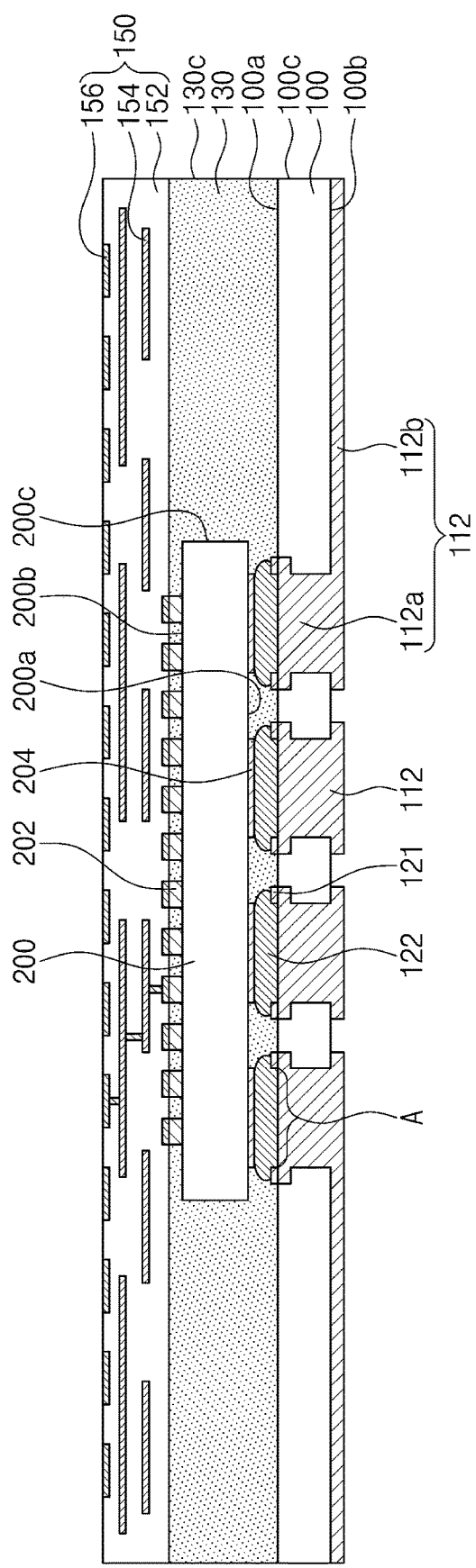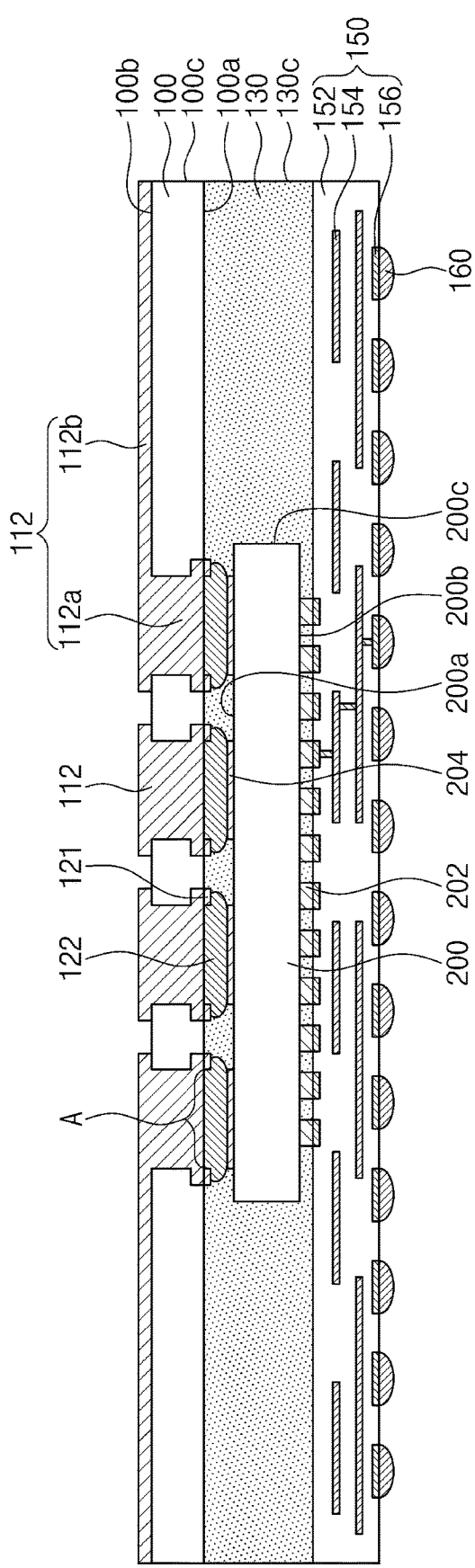

SEMICONDUCTOR PACKAGE

CROSS-REFERENCE TO RELATED APPLICATION

This U.S. non-provisional patent application claims priority under 35 U.S.C. § 119 to Korean Patent Application No. 10-2019-0074185, filed on Jun. 21, 2019, in the Korean Intellectual Property Office, the disclosure of which is incorporated by reference herein in its entirety.

TECHNICAL FIELD

Exemplary embodiments of the present inventive concept relate to a semiconductor package and, more particularly, to a semiconductor package having an electromagnetic shielding function and an antenna function.

DISCUSSION OF THE RELATED ART

A packaging density may be increased to increase speed and provide miniaturization of an electronic device. However, electromagnetic waves emitted from the electronic device may deteriorate performance of the electronic device. For example, the electromagnetic waves may cause malfunction of a communication device such that critical safety issues may be generated. Thus, electromagnetic shielding techniques for minimizing electromagnetic interference have been under development.

In addition, various techniques (e.g., large-capacity, high-speed and small antenna techniques) have been under development during the development of mobile communication technology in the 5G communication technology.

SUMMARY

According to an exemplary embodiment of the present inventive concept, a semiconductor package includes: a substrate; a semiconductor chip disposed on a first surface of the substrate; solder bumps disposed between a first surface of the semiconductor chip and the substrate; and a redistribution layer provided on a second surface, opposite to the first surface, of the semiconductor chip. The substrate includes substrate patterns, and the substrate patterns cover a second surface of the substrate. The substrate patterns cover 60% to 100% of a total area of the second surface of the substrate.

According to an exemplary embodiment of the present inventive concept, a semiconductor package including: a substrate; a semiconductor chip mounted on a first surface of the substrate; solder bumps disposed between a first surface of the semiconductor chip and the first surface of the substrate; a shielding layer disposed between the semiconductor chip and the solder bumps; and a redistribution layer provided on a second surface, opposite to the first surface, of the semiconductor chip, wherein the substrate includes substrate patterns and an antenna pattern, and wherein the substrate patterns cover a second surface of the substrate.

According to an exemplary embodiment of the present inventive concept, a semiconductor package including: a substrate; a semiconductor chip mounted on a first surface of the substrate; solder bumps disposed between a first surface of the semiconductor chip and the substrate; a solder mask provided on the first surface of the substrate; a shielding layer disposed between the semiconductor chip and the solder bumps; a redistribution layer provided on a second surface, opposite to the first surface, of the semiconductor chip; a molding layer covering a sidewall of the semiconductor chip, and provided between the substrate and the redistribution layer; and vias penetrating the substrate and the molding layer. The substrate includes substrate patterns and an antenna pattern, and the substrate patterns cover a second surface of the substrate. The solder bumps are disposed in regions formed by the solder mask, and the vias include a ground via, a signal via, and a power via. The redistribution layer is electrically connected to the semiconductor chip, and the shielding layer includes an adhesive layer, a shielding metal layer, and a protective layer.

BRIEF DESCRIPTION OF THE DRAWINGS

The above and other features of the present inventive concept will become more apparent by describing in detail exemplary embodiments thereof, with reference to the accompanying drawings, in which.

FIGS. 1A, 1B, 1C, 1D, 1E, and 1F are cross-sectional views illustrating a method for manufacturing a semiconductor package according to an exemplary embodiment of the present inventive concept;

DETAILED DESCRIPTION OF THE EMBODIMENTS

Figure 2:
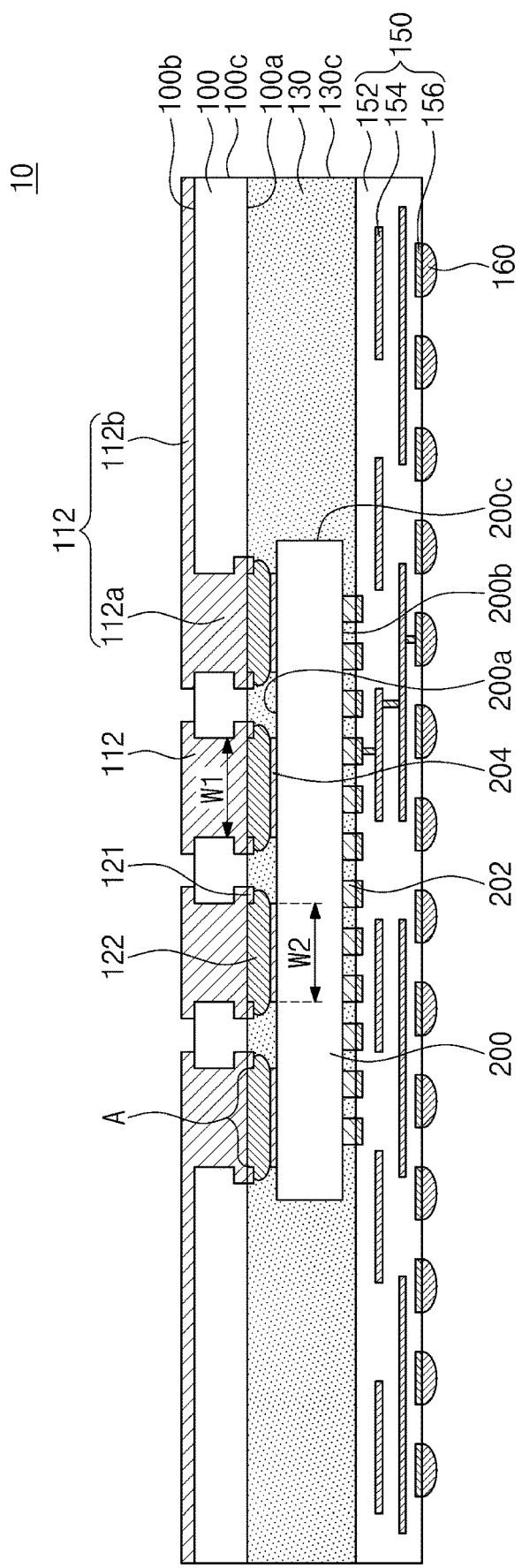
FIG. 2 is a cross-sectional view illustrating a semiconductor package according to an exemplary embodiment of the present inventive concept.

The same reference numerals or the same reference designators may denote the same elements or components throughout the specification and the drawings. Semiconductor packages and methods for manufacturing the sane according to an exemplary embodiment of the present inventive concept will be described hereinafter.

FIGS. 1A, 1B, 1C, 1D, 1E and 1F are cross-sectional views illustrating a method for manufacturing a semiconductor package according to an exemplary embodiment of the present inventive concept.

Referring to FIG. 1A, a substrate 100 may be prepared. The substrate 100 may be a printed circuit board (PCB). For example, the substrate 100 may be a metal thin plate including an insulating layer. The substrate 100 may have a first surface 100a and a second surface 100b. The substrate 100 may be prepared with substrate patterns 112 provided therein. The substrate patterns 112 may vertically penetrate the substrate 100 and may be exposed at a top surface (e.g., the first surface 100a) of the substrate 100. For example, the substrate patterns 112 may be disposed on the second surface 100b and may penetrate the substrate 100 to be exposed at the first surface 100a of the substrate 100. At least one of the substrate patterns 112 may include a first portion 112a and a second portion 112b. A solder mask 121 may be formed on the first surface 100a of the substrate 100. The solder mask 121 may be disposed on the first surface 100a to provide regions A in which solder bumps 122 will be disposed. Thereafter, solder bumps 122 may be formed in the regions A.

Referring to FIG. 1B, a semiconductor chip 200 may be prepared. The semiconductor chip 200 may have one surface 200a (e.g., a first surface) and another surface 200b (e.g., a second surface) opposite to the one surface 200a. The semiconductor chip 200 may be provided with one or more bonding patterns 204 and one or more contact pads 202 adhered to a surface of the semiconductor chip 200. For example, the bonding patterns 204 may be provided on the first surface 200a of the semiconductor chip 200, and the contact pads 202 may be provided on the second surface 200b of the semiconductor chip 200. The semiconductor chip 200 may be disposed on the first surface 100a of the substrate 100 in such a way that the bonding patterns 204 are in contact with the solder bumps 122 formed on the solder mask 121.

A reflow process may be performed after the semiconductor chip 200 is disposed on the substrate 100. The reflow process may include a process of applying heat to the solder bumps 122. After the reflow process, the semiconductor chip 200 may be fixed on the substrate 100 and may be aligned at a predetermined position. For example, the solder bumps 122 melted by the reflow process may be in a liquid state, and thus surface tension of the solder bumps 122 may be increased. Thus, even though the semiconductor chip 200 is misaligned with the predetermined position on the substrate 100, the semiconductor chip 200 may be self-aligned on the substrate 100 by the surface tension. Since the semiconductor chip 200 is self-aligned, it is possible to increase a yield of the process for manufacturing the semiconductor package having a fine pitch.

Referring to FIG. 1C, after the semiconductor chip 200 is fixed on the first surface 100a of the substrate 100, a molding layer 130 may be formed on the substrate 100 and the second surface 200b of the semiconductor chia 200. The molding layer 130 may cover the substrate 100, the solder bumps 122, the semiconductor chip 200, and the contact pads 202. The molding layer 130 may cover the second surface 200b of the semiconductor chip 200 and top surfaces and sidewalls of the contact pads 202.

Referring to FIG. 1D, a top surface 130a of the molding layer 130 may lie polished. For example, the polishing process may be a chemical mechanical polishing (CMP) process. The top surface 130a of the molding layer 130 may be polished in parallel to the substrate 100. Thus, the top surfaces of the contact pads 202 covered by the molding layer 130 may be exposed to the outside.

Referring to FIG. 1E, a redistribution layer 150 may be formed on the second surface 200b of the semiconductor chip 200. The redistribution layer 150 may include an insulating layer 152, redistribution patterns 154, and connection pads 156. For example, the redistribution patterns 154 and the connection pads 156 are formed in the insulating layer 152, and the connection pads 156 are exposed at a first surface of the insulating layer 152.

Referring to FIG. 1F, solder balls 160 may be formed on the connection pads 156, respectively. The semiconductor package including the substrate 100, the semiconductor chip 200 and the redistribution layer 150 may be turned over after the formation of the solder balls 160. The semiconductor package may be connected to an external device through the solder balls 160 in the state in which the semiconductor package is turned over.

FIG. 2 is a cross-sectional view illustrating a semiconductor package according to an exemplary embodiment of the present inventive concept.

Referring to FIG. 2, a semiconductor package 10 according to an exemplary embodiment of the present inventive concept may include a substrate 100, solder bumps 122, a solder mask 121, bonding patterns 204, a molding layer 130, a semiconductor chip 200, contact pads 202, a redistribution layer 150, and solder balls 160. The semiconductor package 10 may be manufactured by the method described above with reference to FIGS. 1A to 1F.

The substrate 100 may be provided. The substrate patterns 112 may be exposed at the First surface 100a and the second surface 100b of the substrate 100. At least one of the substrate patterns 112 may include the First portion 112a and the second portion 112b. The first portion 112a may vertically penetrate the substrate 100. The second portion 112b may be provided on the second surface 100b of the substrate 100. The second portion 112b may be connected to the first portion 112a and may extend to a sidewall 100c of the substrate 100 in a direction parallel to the first surface 100a of the substrate 100. The substrate patterns 112 may be connected to each other through a conductive line. The substrate patterns 112 may include a conductive material. For example, the substrate patterns 112 may include copper (Cu), nickel (Ni), cobalt (Co), aluminum (Al), and/or gold (Au). The substrate patterns 112 may cover portions of the first surface 100a and/or the second surface 100b of the substrate 100 when viewed in a plan view, thereby inhibiting or preventing electromagnetic waves generated in the semiconductor chip 200 from being transmitted to the outside. The substrate patterns 112 may shield or block electromagnetic waves provided from the outside to the semiconductor chip 200 and/or may absorb a portion of the electromagnetic waves. As a result, the semiconductor chip 200 may be protected from the external electromagnetic waves, and thus malfunction of the semiconductor package 10 by electromagnetic interference may be reduced or minimized and operating reliability of the semiconductor package 10 may be increased. An area of the second surface 100b of the substrate 100 covered by the substrate patterns 112 may range from about 60% to 100% of a total area of the substrate IOC when viewed in a plan view. When the area of the second surface 100b of the substrate 100 covered by the substrate patterns 112 ranges from about 60% to 100% of the total area of the substrate 100, the substrate patterns 112 may show or exhibit the electromagnetic shielding function. If the area is less than 60% of the total area, the substrate patterns 112 may not effectively shield the semiconductor chip 200 from the electromagnetic waves. In addition, the substrate patterns 112 may dissipate or release heat generated from the semiconductor chip 200 to the outside. A width W1 of the substrate pattern 112 existing within the substrate 100 may be substantially equal to the maximum width of the region A in which the solder bump 122 to be described later in detail is provided. For example, the first portion 112a, penetrating the substrate 100, has the width W1 substantially equal to the maximum width of region A. Thus, a heat dissipation path may be effectively secured to smoothly dissipate or release the heat to the outside. The substrate patterns 112 may be connected to another semiconductor chip stacked on the semiconductor chip 200 in a package-on-package (PoP) or system-in-package (SiP) structure. However, the shapes of the substrate patterns 112 are not limited to FIG. 2. The term 'connection' used herein may mean 'physical connection' or 'electrical connection'. In addition, the term 'electrical connection' may mean 'direct or indirect connections'.

The solder humps 122 may be provided on the First surface 100a of the substrate 100. For example, the solder bumps 122 may be provided in the regions A formed by the solder mask 121. Thus, the substrate patterns 112 may be aligned with the solder bumps 122, respectively. The solder bumps 122 may induce a metal having a relatively low melting point, for the reflow process. For example, the solder bumps 122 may include lead (Pb), tin (Sb), and/or gold (Au). In addition, the solder bumps 122 may be replaced with a metal layer.

The solder mask 121 may be disposed between the solder bumps 122 and the substrate patterns 112. The solder mask 121 may be provided on the first surface 100a of the substrate 100 to form the regions A in which the solder bumps 122 are provided. For example, the solder mask 121 may include a polymer material. For example, the solder mask 121 may be formed of an epoxy-based insulating ink. The region A may have the same planar shape as the bonding pattern 204 to be described later in detail, and thus the self-alignment effect may be increased or maximized.

The semiconductor chip 200 may be provided on the first surface 100a of the substrate 100. The semiconductor chip 200 may be, for example, an application processor (AP) chip, a memory chip, a radio frequency (RF) chip, a logic chip, or a graphic chip. The semiconductor chip 200 may include semiconductor devices therein. The semiconductor devices in the semiconductor chip 200 may be disposed adjacent to the second surface 200b of the semiconductor chip 200. The second surface 200b of the semiconductor chip 200 may be an active surface.

The contact pads 202 may be provided on the second surface 200b of the semiconductor chip 200. The contact pads 202 may include a conductive material. For example, the contact pads 202 may include copper (Cu), nickel (Ni), cobalt (Co), titanium (Ti), and/or aluminum (Al). The contact pads 202 may be electrically connected to the semiconductor devices in the semiconductor chip 200.

The bonding patterns 204 may be provided on the first surface 200a of the semiconductor chip 200. A width W2 of the bending pattern 204 may be substantially equal to the maximum width of the region A in which the solder bump 122 is provided. Thus, heat generated from the semiconductor chip 200 may be smoothly dissipated. The bonding patterns 204 may increase interface characteristics between the semiconductor chip 200 and the solder bumps 122. For example, the bonding patterns 204 may increase adhesive strength between the semiconductor chip 200 and the solder bumps 122. To achieve this, the bonding patterns 204 may include a metal material. For example, each of the bonding patterns 204 may have a double-layered structure of titanium (Ti) having excellent interface characteristics with silicon (Si) of the semiconductor chip 200 and copper (Cu) having excellent interface characteristics with the solder bumps 122. The bonding patterns 204 may be adhered to the first surface 200a of the semiconductor chip 200 to assist the semiconductor chip 200 to be fixed to the substrate 100 through the solder bumps 122. The bonding patterns 204 may not be electrically connected to the semiconductor devices in the semiconductor chip 200.

The molding layer 130 may be provided on the first surface 100a of the substrate 100. The molding layer 130 may cover the substrate 100, the solder bumps 122, the semiconductor chip 200, and the contact pads 202. The molding layer 130 may cover the second surface 200b of the semiconductor chip 200 and sidewalls of the contact pads 202. For example, first surfaces (e.g., lower surfaces) of the contact pads 202 may be exposed by the molding layer 130. In an exemplary embodiment of the present inventive concept, the molding layer 130 may at least partially cover the top surfaces of the contact pads 202. A width of the molding layer 130 may be substantially equal to a width of the substrate 100. A sidewall 130c of the molding layer 130 may be aligned with a sidewall 100c of the substrate 100. The sidewall 100c of the substrate 100 may not be covered by the molding layer 130 but may be exposed to the outside. The molding layer 130 may protect the semiconductor chip 200 from an impact and may insulate the semiconductor chip 200 from the outside. For example, the molding layer 130 may include a polymer material. For example, the molding layer 130 may include epoxy.

The redistribution layer 150 may be provided on the second surface 200b of the semiconductor chip 200. The redistribution layer 150 may include an insulating layer 152, redistribution patterns 154, and connection pads 156. The insulating layer 152 may include a plurality of layers. The redistribution patterns 154 may include a plurality of conductive layers and a plurality of conductive vias, and may be electrically connected to the semiconductor devices in the semiconductor chip 200. The conductive layers may be provided between the layers of the insulating layer 152. The conductive vias may penetrate at least a portion of the insulating layer 152 to be connected to the conductive layers. The connection pads 156 may be disposed in an upper portion and/or lower portion of the redistribution layer 150. For example, the connection pads 156 may be exposed by the redistribution layer 150 at the lower portion of the redistribution layer 150. The connection pads 156 may be laterally spaced apart from each other. The redistribution patterns 154 and the connection pads 156 may include a conductive material. For example, the redistribution patterns 154 and the connection pads 156 may each include copper (Cu), nickel (Ni), cobalt (Co), aluminum (Al), and/or titanium (Ti). The insulating layer 152 may include an insulating material. For example, the insulating layer 152 may include silicon oxide and/or silicon nitride.

The solder balls 160 may be provided on the connection pads 156, respectively. The solder balls 160 may include a conductive material.

The semiconductor package 10 may be connected to an external device through the solder balls 160. For example, electrical signals generated front the semiconductor devices in the semiconductor chip 200 may be outputted to the outside (e.g., the external device) through the contact pads 202, the redistribution patterns 154, the connection pads 156, and the solder balls 160. Meat generated from the semiconductor chip 200 may be dissipated to the outside through the substrate patterns 112. For example, the heat generated by operations of the semiconductor devices in the semiconductor chip 200 may be dissipated to the outside through the bonding patterns 204, the solder bumps 122, and the substrate patterns 112. The bonding patterns 204, the solder bumps 122 and the substrate patterns 112 may include materials having relatively high heat transfer coefficients, and thus the heat may be easily dissipated or released. At least one of the substrate patterns 112 may include the second portion 112b. For example, the second portion 112b may be connected to the first portion 112a and may further extend along the second surface 100b of the substrate 100 such that at least a portion of the second surface 100b of the substrate 100 is covered. Thus, the area of the substrate patterns 112 dissipating the heat may be increased to increase heat dissipation efficiency. Since the heat is easily dissipated, malfunction of the semiconductor package 10 may be reduced or minimized and operating reliability of the semiconductor package 10 may be increased. A direction in which the electrical signals generated from the semiconductor devices in the semiconductor chip 200 are outputted to the outside through the solder balls 160 may be anti-parallel to a direction in which the heat generated from the semiconductor chip 200 is dissipated to the outside through the substrate patterns 112. For example, heat generated from the semiconductor chip 200 may be dissipated in a direction toward the substrate 100, and the electrical signals may be generated from the semiconductor chip 200 in a direction toward the redistribution layer 150.

Figure 3:
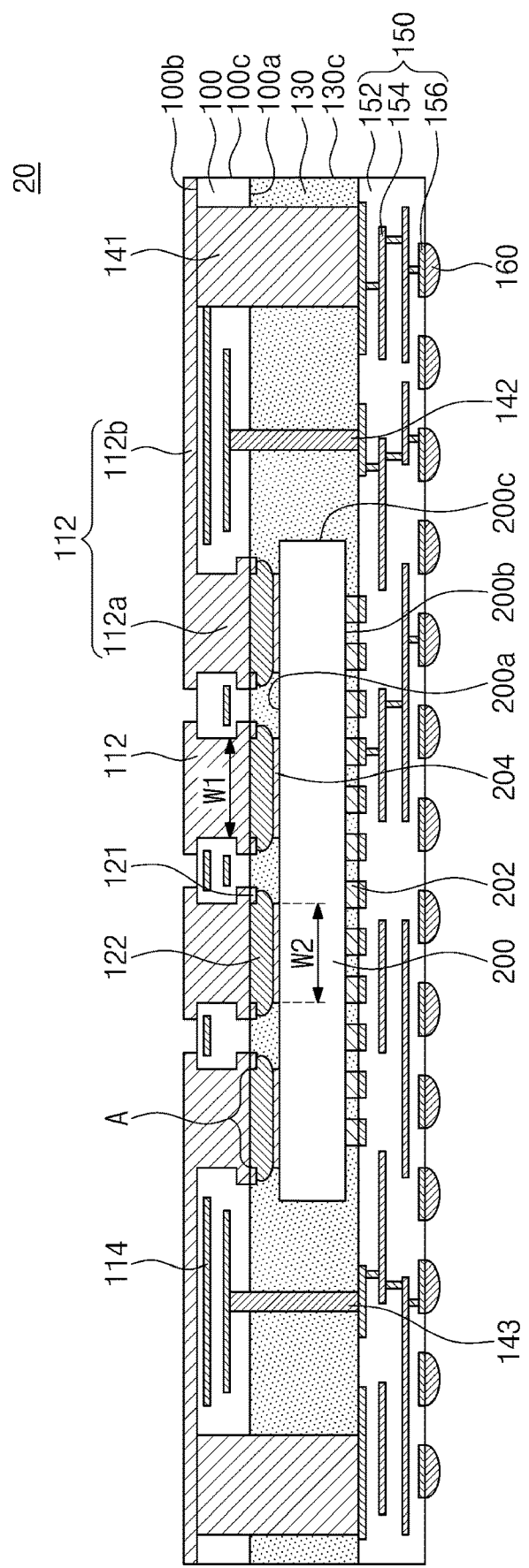
FIG. 3 is a cross-sectional view illustrating a semiconductor package according to an exemplary embodiment of the present inventive concept.

FIG. 3 is a cross-sectional view illustrating a semiconductor package according to an exemplary embodiment of the present inventive concept.

Referring to FIG. 3, a semiconductor package 20, according to an exemplary embodiment of the present inventive concept, may include a substrate 100, solder bumps 122, a solder mask 121, bonding patterns 204, a molding layer 130, a ground via 141, a power via 142, a signal via 143, a semiconductor chip 200, contact pads 202, a redistribution layer 150, and solder balls 160. The substrate 100, the solder bumps 122, the molding layer 130, the solder mask 121, the bonding patterns 204, the semiconductor chip 200, the contact pads 202, the redistribution layer 150 and the solder balls 160 may be substantially the same as those described above with reference to FIGS. 1A to 1F and 2. Hereinafter, the descriptions to the same features which have been described in the above embodiments will be omitted for the purpose of ease and convenience in explanation.

The substrate 100 may include an antenna pattern 114. The antenna pattern 114 may be provided within the substrate 100. For example, the antenna pattern 114 may have a bent or curved conductive line shape. The antenna pattern 114 may include a conductive material, for example, copper (Cu), nickel (Ni), cobalt (Co), aluminum (Al), and/or gold (Au). The antenna pattern 114 may be connected to the ground via 141. The ground via 141 may penetrate the substrate 100 and the molding layer 130 to connect the antenna pattern 114 and the redistribution patterns 154. The ground via 141 may be connected to the substrate patterns 112. For example, the antenna pattern 114 may be grounded through the ground via 141, the redistribution patterns 154, the connection pads 156, and the solder balls 160. The antenna pattern 114 may be connected to the power via 142. The power via 142 may penetrate the substrate 100 and the molding layer 130 to connect the antenna pattern 114 and the redistribution patterns 154 to each other. For example, the antenna pattern 114 may be electrically connected to an external power source through the solder balls 160, the redistribution patterns 154, and the power via 142. Therefore, a potential difference may be generated in the antenna pattern 114, and thus a current may flow through the antenna pattern 114. The antenna pattern 114 may be connected to the signal via 143. The signal via 143 may penetrate the substrate 100 and the molding layer 130 to connect the antenna pattern 114 and the redistribution patterns 154 to each other. For example, a current may flow into the antenna pattern 114 through the solder balls 160, the connection pads 156, the redistribution patterns 154, and the signal via 143. The current may be an electrical signal inputted to the antenna pattern 114. The ground via 141, the power via 142 and the signal via 143 may include a conductive material. For example, the ground via 141, the power via 142 and the signal via 143 may include copper (Cu), nickel (Ni), cobalt (Co), aluminum (Al), and or gold (Au). The positions and the numbers of the ground via 141, the power via 142 and the signal via 143 are not limited to FIG. 3 and may be variously modified. When an electrical signal is inputted to the antenna pattern 114, the semiconductor package 20 may perform a communication function without an additional antenna structure. Thus, the small and thin semiconductor package 20 having the communication function may be realized.

The substrate patterns 112 may be connected to the ground via 141 and thus may be grounded. However, the substrate patterns 112 may not be electrically connected to the power via 142 and the signal via 143.

The substrate patterns 112 and the antenna pattern 114 may be disposed on the first surface 200a of the semiconductor chip 200 to cover the semiconductor chip 200. Thus, the substrate patterns 112 and the antenna pattern 114 may block external electromagnetic waves to protect the semiconductor chip 200, and/or the substrate patterns 112 and the antenna pattern 114 may inhibit or prevent electromagnetic waves generated in the semiconductor chip 200 from being transmitted to the outside. As a result, the substrate 100 may perform both the electromagnetic shielding function and the antenna function, and thus the small and thin semiconductor package 20 may be manufactured or realized. In addition, when a current is applied to the substrate patterns 112, the substrate patterns 112 may better absorb electromagnetic waves to increase the efficiency of the electromagnetic shielding function.

Figure 4:
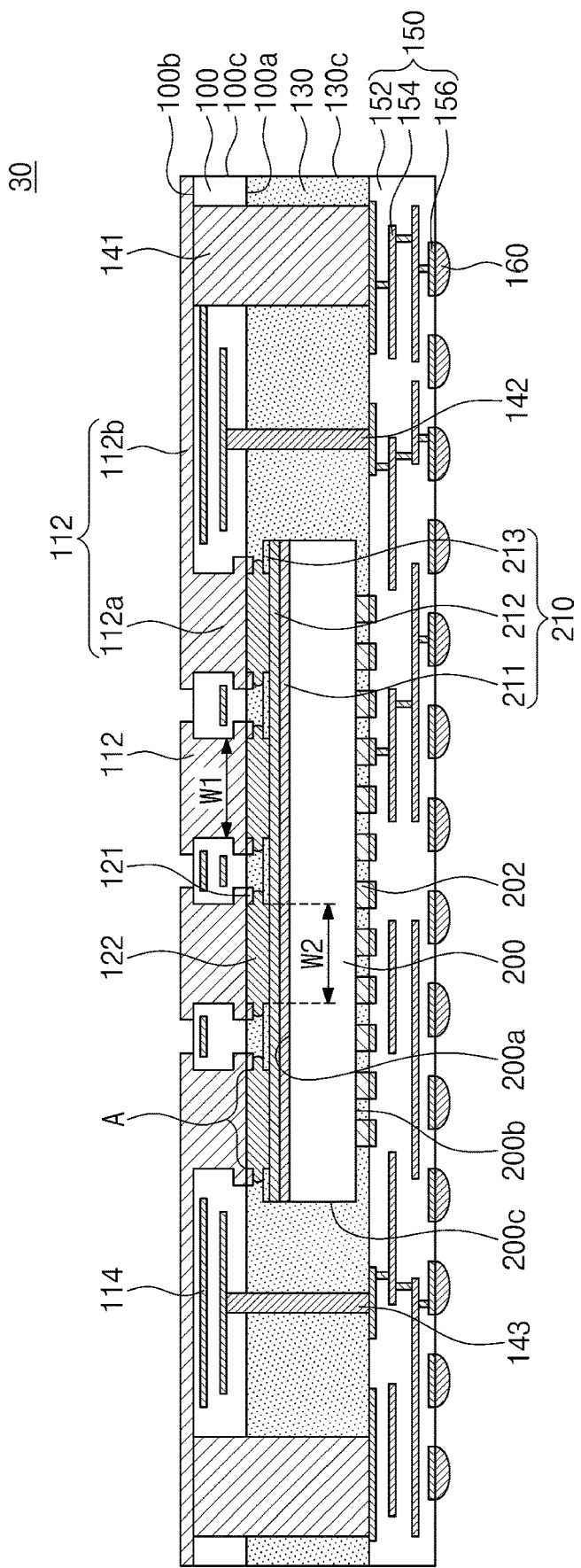
FIG. 4 is a cross-sectional view illustrating a semiconductor package according to an exemplary embodiment of the present inventive concept.

FIG. 4 is a cross-sectional view illustrating a semiconductor package according to an exemplary embodiment of the present inventive concept.

Referring to FIG. 4, a semiconductor package 30, according to an exemplary embodiment of the present inventive concept, may include a substrate 100, solder bumps 122, a solder mask 121, a molding layer 130, a ground via 141, a power via 142, a signal via 143, a semiconductor chip 200, a shielding layer 210, contact pads 202, a redistribution layer 150, and solder balls 160. The substrate 100, the solder bumps 122, the molding layer 130, the solder mask 121, the semiconductor chip 200, the contact pads 202, the redistribution layer 150 and the solder balls 160 may be substantially the same as those described above with reference to FIGS. 1A to 1F and 2. The ground via 141, the power via 142 and the signal via 143 may be substantially the same as those described with reference to FIG. 3. Hereinafter, the descriptions to the same features in which have been described in the above embodiments will be omitted for the purpose of ease and convenience in explanation.

The shielding layer 210 may be provided on the first surface 200a of the semiconductor chip 200. The shielding layer 210 may include an adhesive layer 211, a shielding metal layer 212, and a protective layer 213. The adhesive layer 211 may be provided on the first surface 200a of the semiconductor chip 200. The adhesive layer 211 may cover the first surface 200a of the semiconductor chip 200. For example, the adhesive layer 211 may completely cover the first surface 200a of the semiconductor chip 200. The adhesive layer 211 may include a metal having excellent adhesive properties with silicon (Si) of the semiconductor chip 200. For example, the adhesive layer 211 may include titanium (Ti). Thus, the adhesive layer 211 may be disposed between the semiconductor chip 200 and the shielding metal layer 212 to fix the shielding metal layer 212 to the semiconductor chip 200.

The shielding metal layer 212 may be provided on a top surface of the adhesive layer 211. The shielding metal layer 212 may cover the top surface of the adhesive layer 211. For example, the shielding metal layer 212 may completely cover the top surface of the adhesive layer 211. The shielding metal layer 212 may include a metal material. For example, the shielding metal layer 212 may include copper (Cu). The shielding metal layer 212 may be disposed on the first surface 200a of the semiconductor chip 200 to shield external electromagnetic waves, thereby protecting the semiconductor chip 200. In addition, the shielding metal layer 212 may not transmit electromagnetic waves generated from the semiconductor chip 200 to the outside. Thus, deterioration of performance of the semiconductor package 30 caused by the external electromagnetic waves may be prevented.

The protective layer 213 may be provided on a top surface of the shielding metal layer 212. The protective layer 213 may cover at least a portion of the top surface of the shielding metal layer 212. For example, the protective layer 213 may cover portions of the top surface of the shielding metal layer 212 that are not in contact with the solder bumps 122. The protective layer 213 may include an insulating polymer. For example, the protective layer 213 may include Polyimide (PI). The protective layer 213 may prevent the shielding metal layer 212 from being oxidized. The protective layer 213 may protect the shielding metal layer 212 from an external impact. The electromagnetic shielding function of the semiconductor package 30 may be increased by including the shielding layer 210 which is in direct contact with the first surface 200a of the semiconductor chip 200.

Figure 5:
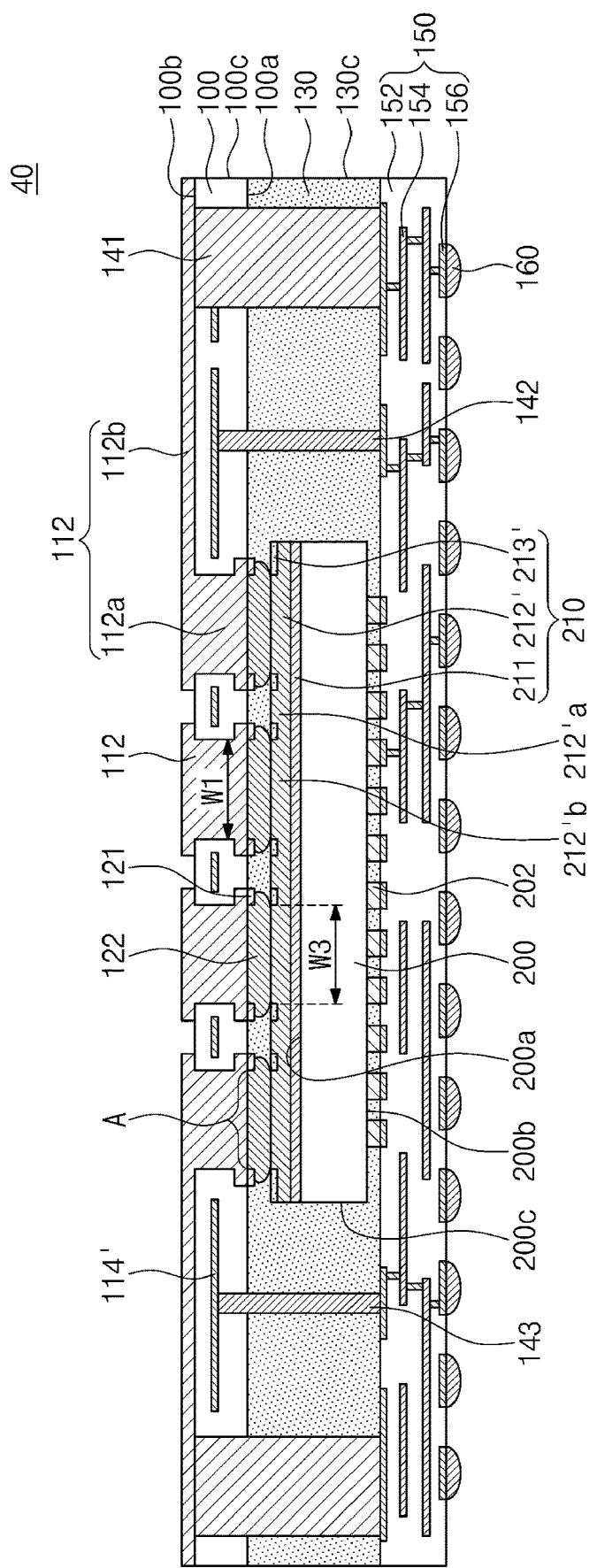
FIG. 5 is a cross-sectional view illustrating a semiconductor package according to an exemplary embodiment of the present inventive concept.

FIG. 5 is a cross-sectional view illustrating a semiconductor package according to an exemplary embodiment of the present inventive concept.

Referring to FIG. 5, a semiconductor package 40, according to an exemplary embodiment of the present inventive concept, may include a substrate 100, solder bumps 122, a solder mask 121, a molding layer 130, a ground via 141, a power via 142, a signal via 143, a semiconductor chip 200, a shielding layer 210, contact pads 202, a redistribution layer 150, and solder balls 160. The solder bumps 122, the molding layer 130, the solder mask 121, the semiconductor chip 200, the contact pads 202, the redistribution layer 150 and the solder balls 160 may be substantially the same as those described above with reference to FIGS. 1A to 1F and 2. The ground via 141, the power via 142 and the signal via 143 may be substantially the same as those described with reference to FIG. 3. Hereinafter, the descriptions to the same features in which have been described in the above embodiments will be omitted for the purpose of ease and convenience in explanation.

The substrate 100 may include an antenna pattern 114'. The antenna pattern 114' may be provided within the substrate 100. When the antenna pattern 114' is formed as a plurality of layers in the substrate 100, a process cost may be increased. Thus, the antenna pattern 114' may be formed by patterning a singe layer. As a result, production efficiency of the antenna pattern 114' may be increased. The antenna pattern 114' may have a bent or curved shape. The antenna pattern 114' may include a conductive material, for example, copper (Cu), nickel (Ni), cobalt (Co), aluminum (Al), and/or gold (Au).

The shielding layer 210 may be provided on the first surface 200a of the semiconductor chip 200. The shielding layer 210 may include an adhesive layer 211, a shielding metal layer 212', and a protective layer 213'. The adhesive layer 211 may be the same as that described with reference to FIG. 4. The shielding metal layer 212' and the protective layer 213' may be substantially the same as those described with reference to FIG. 4. However, an upper portion of the shielding metal layer 212' may include a pattern portion 212'a and a contact portion 212'b. For example, a portion of the upper portion of the shielding metal layer 212' may be etched to form recesses. The pattern portion 212'a may be formed between the recesses. The recesses may be filled with the protective layer 213'. A width W3 of the contact portion 212'b may be substantially equal to the maximum width of the region A in which the solder bump 122 is provided. For example, contact portion 212'b may contact the solder bumps 122 and may have a width larger than that of the pattern portion 212'a. For example, the pattern portion 212'a may have a bent or curved shape. The pattern portion 212'a may function as an antenna of the semiconductor package 40. For example, a current may flow through the pattern portion 212'a, and the current may be an electrical signal inputted to the pattern portion 212'a. For example, the current may flow from the outside into the pattern portion 212'a through the solder balls 160, the redistribution patterns 154, the contact pads 202, and internal interconnection lines and vias of the semiconductor chip 200. When the current flows through the pattern portion 212'a, the pattern portion 212'a may function as the antenna of the semiconductor package 40, and thus a communication function may be realized in the semiconductor package 40 without an additional antenna structure. When the antenna pattern 114' is formed by patterning a single layer, the pattern portion 212'a may be additionally provided on the first surface 200a of the semiconductor chip 200. Thus, the antenna performance of the semiconductor package 40 may be reinforced.

In the semiconductor packages 10, 20, 30 and 40 according to exemplary embodiments of the present inventive concept, the sidewall 100c of the substrate 100 and the sidewall 130c of the molding layer 130 may be exposed to the outside. Thus, moisture generated in the semiconductor packages 10, 20, 30 and 40 may be smoothly discharged or released to prevent chip damage by the moisture, for example, a crack (e.g., a popcorn crack) occurring at the semiconductor chip 200.

The semiconductor package according to an exemplary embodiment of the present inventive concept may include the substrate patterns and/or the antenna pattern in the substrate. Thus, the performance of the semiconductor package may be increased, and a small and thin semiconductor package may be realized.

While the present inventive concept has been particularly shown and described with reference to exemplary embodiments thereof, it will be apparent to those of ordinary skill in the art that various changes in form and detail may be made thereto without departing from the spirit and scope of the present inventive concept as defined by the following claims.

What is claimed is:

1. A semiconductor package comprising:
a substrate;
a semiconductor chip disposed on a first surface of the substrate;
solder bumps disposed between a first surface of the semiconductor chip and the substrate; and
a redistribution layer provided on a second surface, opposite to the first surface, of the semiconductor chip; and
a ground via penetrating the substrate,
wherein the substrate comprises substrate patterns and an antenna pattern, wherein the ground via is connected to the antenna pattern,
wherein the substrate patterns cover a second surface of the substrate, and
wherein the substrate patterns cover 60% to 100% of a total area of the second surface of the substrate.

2. The semiconductor package of claim 1, further comprising:

a molding layer provided between the substrate and the redistribution layer; and vias penetrating the substrate and the molding layer, wherein the vias comprise a power via and a signal via.

3. The semiconductor package of claim 2, wherein the redistribution layer comprises redistribution patterns, and wherein the signal via is connected to the antenna pattern and at least one of the redistribution patterns.

4. The semiconductor package of claim 2, wherein the redistribution layer comprises redistribution patterns, and wherein the ground via is connected to at least one of the redistribution patterns.

5. The semiconductor package of claim 2, further comprising:

bonding patterns disposed between the semiconductor chip and the solder bumps.

6. The semiconductor package of claim 5, wherein the redistribution layer comprises connection pads, wherein solder balls are provided on the connection pads, respectively, and wherein the semiconductor chip includes semiconductor devices electrically connected to the solder balls.

7. The semiconductor package of claim 6, farther comprising:

a solder mask provided on the first surface of the substrate, wherein the solder mask forms regions in which the solder bumps are provided.

8. The semiconductor package of claim 7, wherein the regions in which the solder bumps are provided have shapes corresponding to shapes of the bonding patterns.

9. The semiconductor package of claim 7, wherein each of the substrate patterns has a first portion vertically penetrating the substrate and a second portion connected to the first portion, and wherein a width of the first portion is substantially equal to a maximum width of each of the regions in which the solder bumps are provided.

10. A semiconductor package comprising:

a substrate;

a semiconductor chip mounted on a first surface of the substrate;

solder bumps disposed between a first surface of the semiconductor chip and the first surface of the substrate;

a shielding layer disposed between the semiconductor chip and the solder bumps; and a redistribution layer provided on a second surface, opposite to the first surface, of the semiconductor chip, wherein the substrate comprises substrate patterns and an antenna pattern, and wherein the substrate patterns cover a second surface of the substrate.

11. The semiconductor package of claim 10, wherein the substrate patterns cover 60% to 100% of a total area of the second surface of the substrate.

12. The semiconductor package of claim 10, further comprising:

a molding layer provided between the substrate and the redistribution layer; and vias penetrating the substrate and the molding layer, wherein the vias comprise a ground via, a power via, and a signal via.

13. The semiconductor package of claim 12, wherein the redistribution layer comprises redistribution patterns, and wherein the ground via is connected to at least one of the substrate patterns and at least one of the redistribution patterns.

14. The semiconductor package of claim 13, wherein the shielding layer comprises: an adhesive layer, a shielding metal layer and a protective layer stacked on the semiconductor chip.

15. The semiconductor package of claim 14, wherein the adhesive layer covers the first surface of the semiconductor chip, and wherein the shielding metal layer covers a first surface of the adhesive layer.

16. The semiconductor package of claim 14, wherein the shielding metal layer includes a contact portion and a pattern portion in an upper portion of the shielding metal layer.

17. The semiconductor package of claim 16, wherein the shielding metal layer is connected to the ground via and one of the substrate patterns.

18. The semiconductor package of claim 12, further comprising:

a solder mask provided on the first surface of the substrate, wherein the solder mask forms regions in which the solder bumps are provided.

19. The semiconductor package of claim 18, wherein each of the substrate patterns has a first portion vertically penetrating the substrate and a second portion connected to the first portion, and wherein a width of the first portion is substantially equal to a maximum width of each of the regions in which the solder bumps are provided.

20. A semiconductor package comprising:

a substrate;

a semiconductor chip mounted on a first surface of the substrate;

solder bumps disposed between a first surface of the semiconductor chip and the substrate;

a solder mask provided on the first surface of the substrate;

a shielding layer disposed between the semiconductor chip and the solder bumps;

a redistribution layer provided on a second surface, opposite to the first surface, of the semiconductor chip;

a molding layer covering a sidewall of the semiconductor chip, and provided between substrate and the redistribution layer; and vias penetrating the substrate and the molding layer, wherein the substrate comprises substrate patterns and an antenna pattern, wherein the substrate patterns cover a second surface of the substrate, wherein the solder bumps are disposed in regions formed by the solder mask, wherein the vias comprise a ground via, a signal via, and a power via, wherein the redistribution layer is electrically connected to the semiconductor chip, and wherein the shielding layer comprises an adhesive layer, a shielding metal layer, and a protective layer.

* * * * *